US007340367B2

(12) United States Patent
Inoue et al.

(10) Patent No.: US 7,340,367 B2
(45) Date of Patent: Mar. 4, 2008

(54) FAN CONTROL APPARATUS AND FAN CONTROL METHOD

(75) Inventors: Kenichi Inoue, Kanagawa (JP); Toshiaki Notsuyu, Kanagawa (JP)

(73) Assignee: Sony Corporation (JP)

( * ) Notice: Subject to any disclaimer, the term of this patent is extended or adjusted under 35 U.S.C. 154(b) by 735 days.

(21) Appl. No.: 10/784,439

(22) Filed: Feb. 23, 2004

(65) Prior Publication Data

US 2004/0200630 A1 Oct. 14, 2004

(30) Foreign Application Priority Data

Feb. 27, 2003 (JP) ............................ P2003-051846

(51) Int. Cl.
*G06F 15/00* (2006.01)
(52) U.S. Cl. ........................ 702/132; 702/136; 702/176
(58) Field of Classification Search ................ 702/132, 702/136, 176
See application file for complete search history.

(56) References Cited

U.S. PATENT DOCUMENTS 5,544,036 A * 8/1996 Brown et al. .......... 340/825.24
5,619,192 A * 4/1997 Ayala ..................... 340/870.02
5,748,104 A * 5/1998 Argyroudis et al. ... 340/870.11

* cited by examiner

*Primary Examiner*—Thomas R. Peeso
(74) *Attorney, Agent, or Firm*—Lerner, David, Littenberg, Krumholz & Mentlik, LLP

(57) ABSTRACT

A fan control apparatus and method to reduce the temperature in an equipment body by a time control when setting a stop period constant at the start by adding a time axis fan control by means of a temperature sensor. The fan control apparatus includes a temperature sensor that detects the temperature in the equipment body; a CPU and a sub-microcomputer perform the control of the cooling fans according to the detected temperature value. The CPU performs communication with a server connected to the equipment body via a network, and the CPU and sub-microcomputer perform the control of the cooling fans according to the time value based on a previous communication start and the present communication start.

8 Claims, 6 Drawing Sheets

Block diagram showing constitution of fan control system

Block diagram showing constitution of fan control system

Flowchart showing polling set operation

Flowchart showing fan control operation according to time of power on and power off Diagram showing definition of Ton and Toff Diagram showing internal arrangement of equipment

FAN CONTROL APPARATUS AND FAN CONTROL METHOD

BACKGROUND OF THE INVENTION

Field of the Invention

The present invention relates to a fan control apparatus and a fan control method, for example, for cooling a heat generating portion in equipment by using a cooling fan.

In a conventional fan control apparatus which cools, for example, a power supply unit or an actuator of heat generating portions by using a cooling fan, the cooling fan is always made rotated when the power supply of the equipment body is turned on.

[Patent Document 1]

Japanese Laid-open Patent publication No. 2001-56724

However, in the above mentioned conventional fan control apparatus, the cooling fan is always rotated whenever the power supply of the equipment body is turned on, so that there was a disadvantage that a rotation noise is always generated caused by the rotation of the cooling fan and the quality of the equipment goes down by the undesired sound in an environment where quietness is required.

Additionally, there is a method where the drive voltage is lowered such that the rotational frequency is dropped down and the like in order to reduce the rotation noise of the cooling fan, but there is a limit in order to achieve the operation with a satisfactory cooling function.

According to the control of the present invention, the fan control is performed by a feedback using a temperature sensor and at the same time the cooling fan is stopped at the time of polling for controlling the time axis such that the rotation noise can be reduced.

At that time, the temperature in the equipment body becomes saturated in approximately 1 hour, but it sometimes happens that the temperature in the equipment body increased beyond the saturation temperature during when the rotation of the fan is stopped if the supply of the power supply voltage of the equipment body is stopped by the polling start or end or by operating the power switch after the temperature in the equipment body reaches the saturation temperature and just subsequently if the supply of the power supply voltage of the equipment body is started.

Consequently, the control according to the present invention has a subject matter to lower the temperature rise in the equipment body in a case when the temperature in the equipment body increases beyond the saturation temperature if the supply of the power supply voltage of the equipment body is stopped after the temperature in the equipment body reaches the saturation temperature, just subsequently if the supply of the power supply voltage of the equipment body is started, and if this condition is repeated, the temperature increases moreover.

The difference between the present invention and the patent document 1 will be shown hereinafter. According to the claim of this patent document 1, the fan control method has a feature that a register value corresponding to a measured temperature is transferred to a fan rotational frequency control IC so as to produce a drive voltage within the IC for controlling the fan.

The patent document 1 has a feature of controlling by means of SM bus since it is a general matter that the temperature in the equipment is measured by a temperature sensor for controlling the fan while in this point of view, firstly the temperature measured by the temperature sensor is converted to a voltage in the fan control method according to the present invention. Secondly, a sub microcomputer (micom) AD converts that voltage and downloads it to the micom as time-series data. Thirdly, the temperature data and set data are compared by a control program so as to perform the fan control. Fourthly, the fan operation voltage is an output of a 4-terminal regulator in a power supply circuit and controlled by H/L of FAN_CONT signal from the sub micom. Fifthly, there is a difference in that the present application does not use the special SM bus but uses an AD converting function of the sub micom for converting the measured temperature to data and performing a program control.

Especially, speaking of the difference of the present invention with respect to the patent document 1, there is a big difference in that a time axis fan control is added to the fan control by the temperature sensor when performing a local control by the sub micom without using the SM bus. When performing a fan control where the temperature control is preferential, the fan cannot be stopped, for example, for a few minutes at the starting time and moreover, it is impossible to set a constant stop period. A timer is used for setting a duration corresponding to the absolute time in order to stop the fan, for example, for a few minutes from the starting time of the equipment. After a few minutes elapse, it is shifted to a fan control by means of the temperature sensor. At this time, the cooling fan is controlled when the equipment is made to be power-off state after an elapsed time when the temperature in the equipment body is predicted to reach the saturation temperature and when just subsequently, the apparatus is made to be power-on state.

The polling operation which requires an operation program to be renewed and the like for the equipment with respect to a server connected via the network continues less than approximately a few minutes after the equipment is activated, so that the purpose of the present invention is to stop the fan during that period in order to reduce noises and similarly to reduce power consumption. At this time, the temperature in the equipment body is lowered by controlling the fan according to a predicted time when the temperature in the equipment body will reach the saturation temperature.

In the patent document 1, in case of a fan control only by the temperature sensor, the fan is made stopped at the starting time and is turned on when the temperature becomes higher than the upper limit. When the temperature becomes higher than the upper limit, the fan rotates. Conversely, when it is lower than the upper limit, the fan remains in a stop state such that the temperature of the equipment increases rapidly. Consequently, the fan rotates again and cools the inside of the equipment. If the upper limit value is lowered, the fan repeats on and off in a short period such that a so-called hunting phenomenon occurs and it is impossible to make the stop period constant unless a time axis control according to the present invention is adopted.

SUMMARY OF THE INVENTION

Consequently, the present invention was made in view of the aforementioned aspect and the subject matter thereof is to propose a fan control apparatus and a fan control method which can reduce the temperature in the equipment body by a time control when setting the stop period constant at the starting time by adding a time axis fan control additively to a fan control by means of a temperature sensor.

A fan control apparatus according to the present invention comprises temperature detecting means for detecting the temperature in the equipment body; temperature control means for controlling the cooling fan according to the temperature value detected by the temperature detecting means; communication means for communicating with a server connected to the equipment body by means of a network; and time control means for controlling the cooling fan according to the time value based on at least previous and this time communication commencements by the communication means; wherein the control of the cooling fan is performed by using the temperature control means and the time control means.

Accordingly, the following operation is achieved according to the present invention.

The fan control of the cooling fan is performed by using temperature control means and time control means in order to reduce noises in the main body equipment which has a communication function using communication means with the server connected to the network.

In recent years, there have been a lot of equipments for the digital audio and/or video equipments where cooling by a fan is necessary. Communication means has a function of polling as one of network connecting functions. It is possible by means of the communication means that the server downloads reservation program information and version upgrade programs periodically and automatically to the client equipments at every starting time by means of polling which is set by users. In the conventional technology, the fan rotates and generates noises whenever the main body equipment is activated, so that the rotational frequency of the fan is controlled for noise reduction, but there is a limit thereabout.

Consequently, the improvement according to the present invention lies in that the cooling fan is controlled according to the time value based on the at least previous and this time communication commencements by the communication means using the time control means in addition to the feedback of the detected temperature value to the temperature control means using the temperature detecting means where noise reduction can be realized by the time axis control of the fan. More specifically, as the polling period by the communication means is a short period, it is possible to reduce noises by a method which stops the fan operation during a definite duration from the starting time at the polling start by the time control means. At this time, the temperature rises moreover if the fan stops and restarts in a short period when the temperature rising is saturated. Consequently, the temperature can be lowered by performing the fan control based on the predicted time when the temperature in the equipment body reaches the saturation temperature.

Utilizing the fact that the polling period by the communication means of the equipment which has a network connecting function enabling a high speed data communication is short, it is controlled such that the fan is stopped for a definite duration from the starting time by the time control means. In case when the fan is stopped for a definite duration from the starting time, the temperature rises, but it does not rise to saturation degree if the stop period is short.

At this time, the temperature rise in the equipment body is lowered in a case when the temperature in the equipment body increases beyond the saturation temperature if the supply of the power supply voltage of the equipment body is stopped after the temperature in the equipment body reaches the saturation temperature, and just subsequently the supply of the power supply voltage of the equipment body is started, or when the temperature increases moreover if this condition is repeated.

Here, an efficient cooling is attained by performing a fan control according to the predicted time when the temperature in the equipment body reaches the saturation temperature. In this way, it becomes possible to make the equipment with a high reliability by compounding the control utilizing the temperature sensor and the control with the time axis.

Further, a fan control method according to the present invention comprises communication step for communicating by using communication means with a server connected to the equipment body by means of a network; temperature detecting step for detecting the temperature in the equipment body by using temperature detecting means; temperature control step for controlling the cooling fan by using temperature control means according to the temperature value detected by the temperature detecting means; and time control step for controlling the cooling fan by using time control means according to the time value based on at least previous and this time communication commencements by the communication means; wherein the control of the cooling fan is performed by using the temperature control means and the time control means.

Accordingly, the following operation is achieved according to the present invention.

The fan control of the cooling fan is performed by using a temperature control step and a time control step in order to reduce noises in the main body equipment which has a communication function using a communication step with the server connected to the network.

In the communication step, there is provided a polling function which is one of network connecting functions. By the communication step, it becomes possible for the server to download reservation program information and version up programs for every client-equipment periodically and automatically at the starting time by the polling which is set by users.

Consequently, according to the present invention, it is realized to reduce noises by performing a cooling fan control according to the time value based on at least previous and this time communication commencements by the communication step in the time control step in addition to the feedback of the temperature control value for the temperature control step by the temperature detecting step. More specifically, as the polling period in the communication step is short, it is possible to reduce noises by a method of stopping the fan operation during a definite duration from the starting time by the polling start in the time control step. At this time, the temperature rises moreover if the fan is made stopped when the temperature rise is saturated and it is restarted in a short period subsequently. Therefore, the temperature can be lowered by controlling the fan according to the predicted time when the temperature in the equipment body reaches the saturation temperature.

Utilizing the fact that the polling period by the communication step of the equipment which has a network connecting function enabling a high speed data communication is short, it is controlled such that the fan is stopped for a definite duration from the starting time by the time control step. In case when the fan is stopped for a definite duration from the starting time, the temperature rises, but it does not rise to saturation degree if the stop period is short.

BRIEF DESCRIPTION OF THE DRAWINGS

FIG. 4A shows the internal temperature of the equipment body, FIG. 4B shows the power state of the equipment body, FIG. 4C shows the operation of a first fan (FAN 1) 7 and a second fan (FAN 2) 8, and FIG. 4D shows a polling operation;

DESCRIPTION OF THE PREFERRED EMBODIMENTS

Exemplified embodiments according to the present invention will be explained properly with reference to the drawings.

Figure 1:
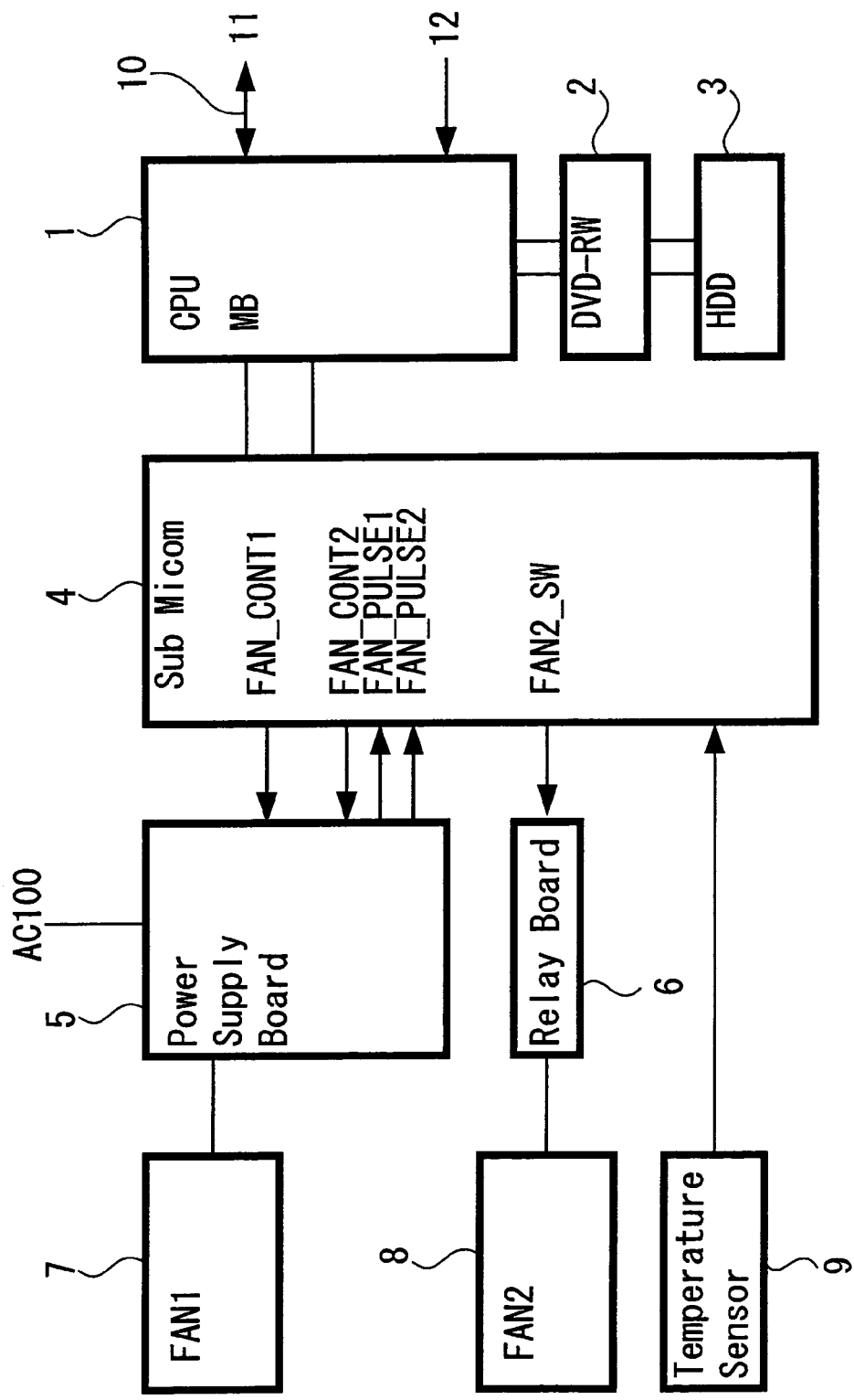
FIG. 1 is a diagram showing a constitution of a fan control system applied to an exemplified embodiment of the present invention.

FIG. 1 is a block diagram showing a constitution of a fan control system applied to an exemplified embodiment according to the present invention.

In FIG. 1, the fan control system is provided on a main board and is constituted to include a CPU (Central Processing Unit) 1 which controls the operation of the equipment, a reproducible DVD-RW (Digital Versatile DISC Rewritable) 2 which records audio data and video data on a detachable disc type recording medium, and an HDD (Hard Disc Drive) 3 which records program data readably and at the same time records audio data and video data reproducibly on a fixed disc type recording medium.

The CPU 1 is connected to a server 11 by means of a network 10 and constituted to have a communication function for downloading reservation program information and version upgrade programs, to have a state control function for shift-controlling from a standby state to a power-on state at every starting time by polling which users set by a timer reservation 12 and to have a time control function for stopping the fan operation for a definite duration from the starting time by the polling commencement which users set by the timer reservation 12 and at the same time for controlling the cooling fan according to the time value based on at least previous and this time communication commnecements by the polling start. The network 10 is applied with, for example, ADSL (Asymmetric Digital Subscriber Line) which makes a high speed data communication possible.

Additionally, the fan control system is constituted to have a sub micom 4, a power supply board 5 which produces from an AC power supply a 5V-system-drive power supply voltage for the CPU 1 and the sub micom 4 and a 12V-system-drive power supply voltage for the fan, the DVD-RW 2 and the HDD 3, a relay board 6 for supplying the 12V-system-drive power supply voltage for a second fan (FAN 2) 8, a first fan (FAN 1) 7, a second fan (FAN 2) 8 and a temperature sensor 9 for detecting an internal temperature.

Figure 6:
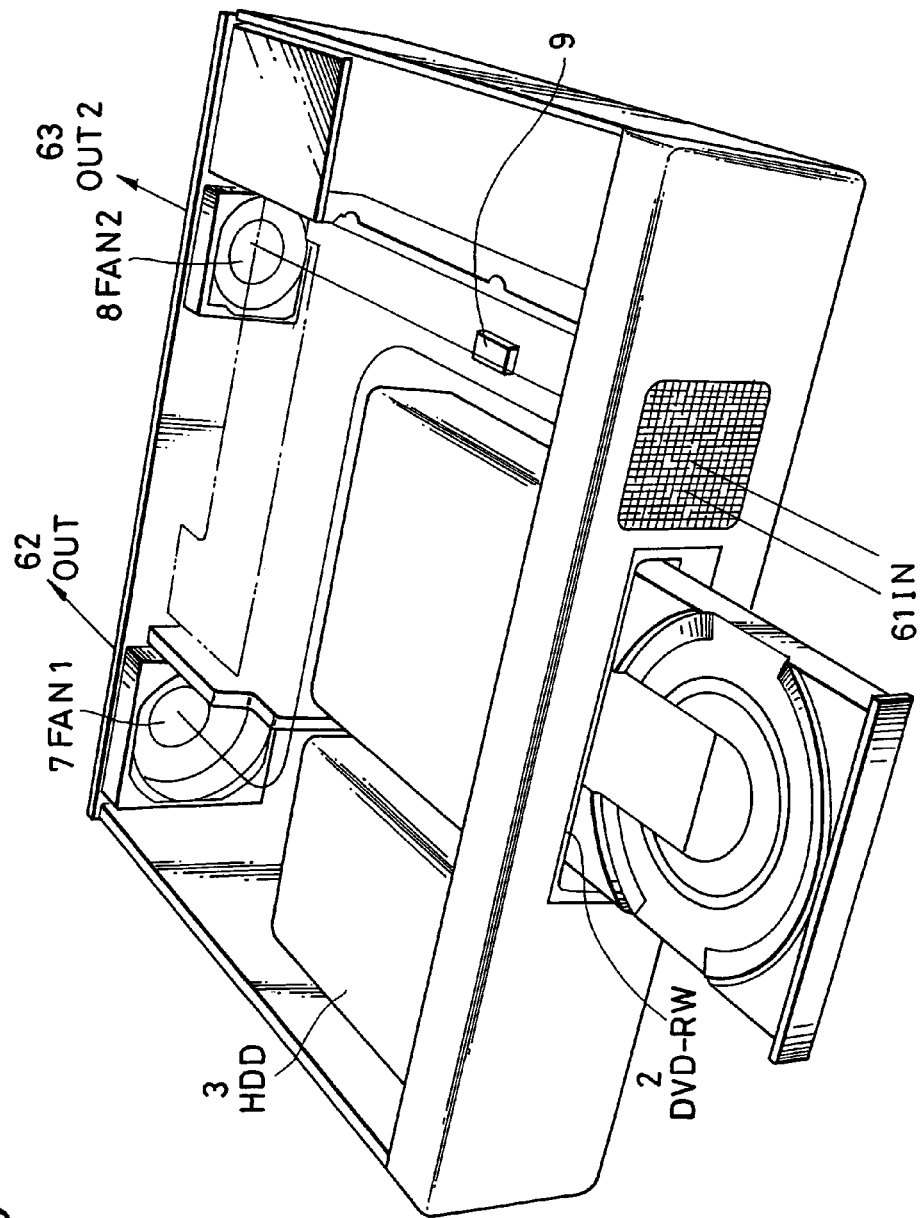
FIG. 6 is a diagram showing an internal arrangement of the equipment.

FIG. 6 is a diagram showing an internal arrangement of the equipment.

In FIG. 6, a main board equipped with the DVD-RW 2 and a peripheral unit of the CPU 1 is arranged at the center from the front to the rear of the equipment, on the other hand the HDD 3 and the power supply unit are arranged on the left side from the front to the rear thereof. Then, an outside air inlet duct IN101 is arranged at the right side of the DVD-RW 2 at the front center, the first fan (FAN 1) 7 is arranged on the rear left side of the equipment, where is linearly rear location with respect to the HDD 3 and the power supply unit, and the second fan (FAN 2) 8 is arranged on the rear center-right side of the equipment, where is linearly rear location with respect to the outside-air inlet duct IN101 on the front center-right side.

Here, the outside-air sucked in from the IN61 is introduced to an OUT1: 62 as a first flow path by the fan (FAN 1) 7, so that the first fan (FAN 1) 7 is used for cooling the power supply unit and the HDD 3. Additionally, the outside-air sucked in from the IN61 is introduced to an OUT2: 63 as a second flow path by the second fan (FAN 2) 8, so that the second fan (FAN 2) 8 is constituted so as to be used for cooling the periphery of the CPU 1 and the DVD-RW 2.

The CPU 1 and the sub micom 4 control the two of the first fan (FAN 1) 7 and the second fan (FAN 2) 8 according to the fan control program. It is constituted such that the rotation of the fan is observed by using the rotation detecting terminals of FAN_PULSE 1 and FAN_PULSE 2.

The temperature sensor 9 constitutes temperature detecting means for detecting the temperature of the equipment body. The temperature sensor 9 is arranged between outside air inlet duct IN61 and the second fan (FAN 2) 8 corresponding to a position which the first flow path and the second flow path will commonly pass.

The CPU 1 and the sub micom 4 constitute temperature control means for controlling the first fan (FAN 1) 7 and the second fan (FAN 2) 8 according to the temperature value detected by the temperature sensor 9.

The CPU 1 constitutes communication means for performing the communication between the equipment body and the server 11 connected by means of the network 10.

The CPU 1 constitutes time control means for performing the control of the first fan (FAN 1) 7 and the second fan (FAN 2) 8 according to the time value based on the communication commencement with respect to the server 11.

The CPU 1 is constituted so as to perform with respect to the server 11 a polling communication of a definite duration at every predetermined time by its communication function and to stop the operation of the first fan (FAN 1) 7 and the second fan (FAN 2) 8 until the value of the definite duration elapses by its time control function.

The CPU 1 is further constituted so as to perform the control of the first fan (FAN 1) 7 and the second fan (FAN 2) 8 according to the time value based on the previous communication end and this time polling communication start.

By the CPU 1, the time value based on the previous and this time polling communication commencements is constituted so as to be set corresponding to the time when the temperature in the equipment body which is detected by the temperature sensor 9 reaches the saturation temperature.

When the equipment is made to be power-off state after an elapsed time when the equipment-body temperature which is detected by the temperature sensor 9 is predicted to reach the saturation temperature and just subsequently the equipment is made to be power-on state, the CPU 1 is constituted so as to perform the control of the first fan (FAN 1) 7 and the second fan (FAN 2) 8.

As mentioned above, the temperature in the equipment body becomes saturated in approximately 1 hour. At that time, in a case when the temperature in the equipment body increases beyond the saturation temperature if the supply of the power supply voltage of the equipment body is stopped after the temperature in the equipment body reaches the saturation temperature, and just subsequently the supply of the power supply voltage of the equipment body is started, or a case when by repeating this condition the temperature increases moreover, the temperature rise in the equipment body is lowered.

Here, an efficient cooling is attained by performing a fan control according to the predicted time when the temperature in the equipment body reaches the saturation temperature. In this way, it becomes possible to make the equipment with a high reliability by compounding the control utilizing the temperature sensor and the control with the time axis.

Figure 5:
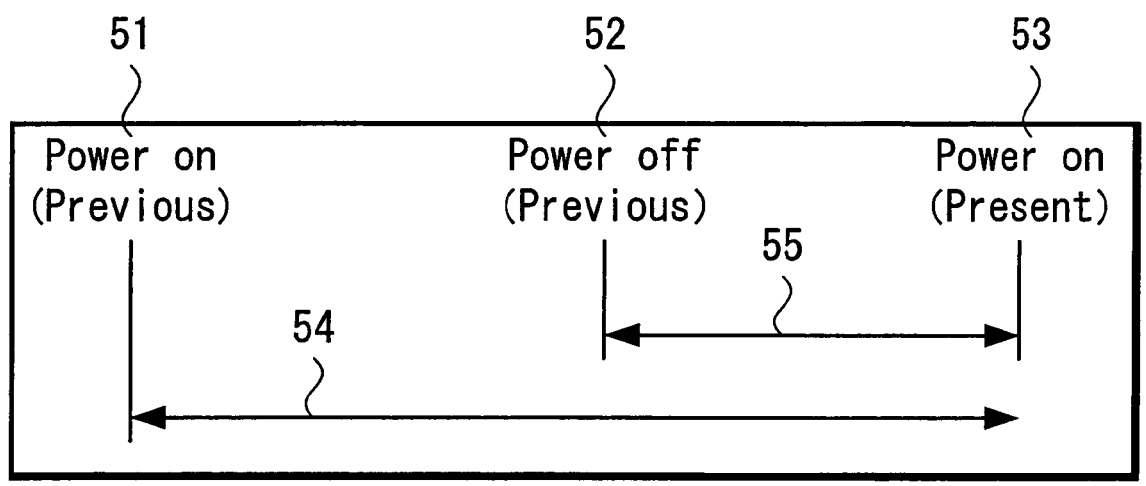
FIG. 5 is a diagram showing the definition of Ton and Toff.

Consequently, by using a timer which users can set according to the timer reservation 12 with respect to the CPU 1, as shown in FIG. 5, the CPU 1 recognizes the duration time (designated as Ton54 hereinafter) from the start (power on) 51 of the supply of the previous power supply voltage for the equipment body until the start (power on) 53 of the supply of this time power supply voltage for the equipment body, also recognizes the duration time (designated as Toff55 hereinafter) from the end (power off) 52 of the supply of the previous power supply voltage for the equipment body until the start (power on) 53 of the supply of this time power supply voltage for the equipment body, compares them with respect to the reference time so as to judge the temperature rising status of the equipment, and executes a control where it is possible to cancel the stop of the first fan (FAN 1) 7 and the second fan (FAN 2) 8. It should be noted that the start and the end herein are not limited to the start of the supply of the power supply voltage (power on) for the equipment body and the end of the supply of the power supply voltage (power off) for the equipment body, but include the rotation start and the rotation stop of the first fan (FAN 1) 7 and the second fan (FAN 2) 8 according to the polling.

If the Ton54 is equal or more than 1 hour and at the same time the Toff55 is within five minutes, it is possible to avoid a rapid increase of the temperature in the equipment by controlling the first fan (FAN 1) 7 and the second fan (FAN 2) 8 according to the flow of a high speed rotation process.

If that condition is not satisfied, it means that the temperature rise is not saturated, so that it means that a temperature rising margin remains for stopping the first fan (FAN 1) 7 and the second fan (FAN 2) 8 for a predetermined period and it is possible to take a process for stopping the first fan (FAN 1) 7 and the second fan (FAN 2) 8 safely as usual for a predetermined period.

Here, if the Ton54 is equal or more than 1 hour and the Toff55 is within five minutes and if the first fan (FAN 1) 7 and the second fan (FAN 2) 8 are not made to be in a high speed rotation, the temperature in the equipment exceeds the saturation temperature of a case existence of a fan. Therefore, if the first fan (FAN 1) 7 and the second fan (FAN 2) 8 are made to be in a high speed rotation, the temperature in the equipment comes to approach the saturation temperature.

The operation of the fan control system applied to the exemplified embodiment according to the present invention which is constituted in this manner will be described hereinafter.

Figure 2:
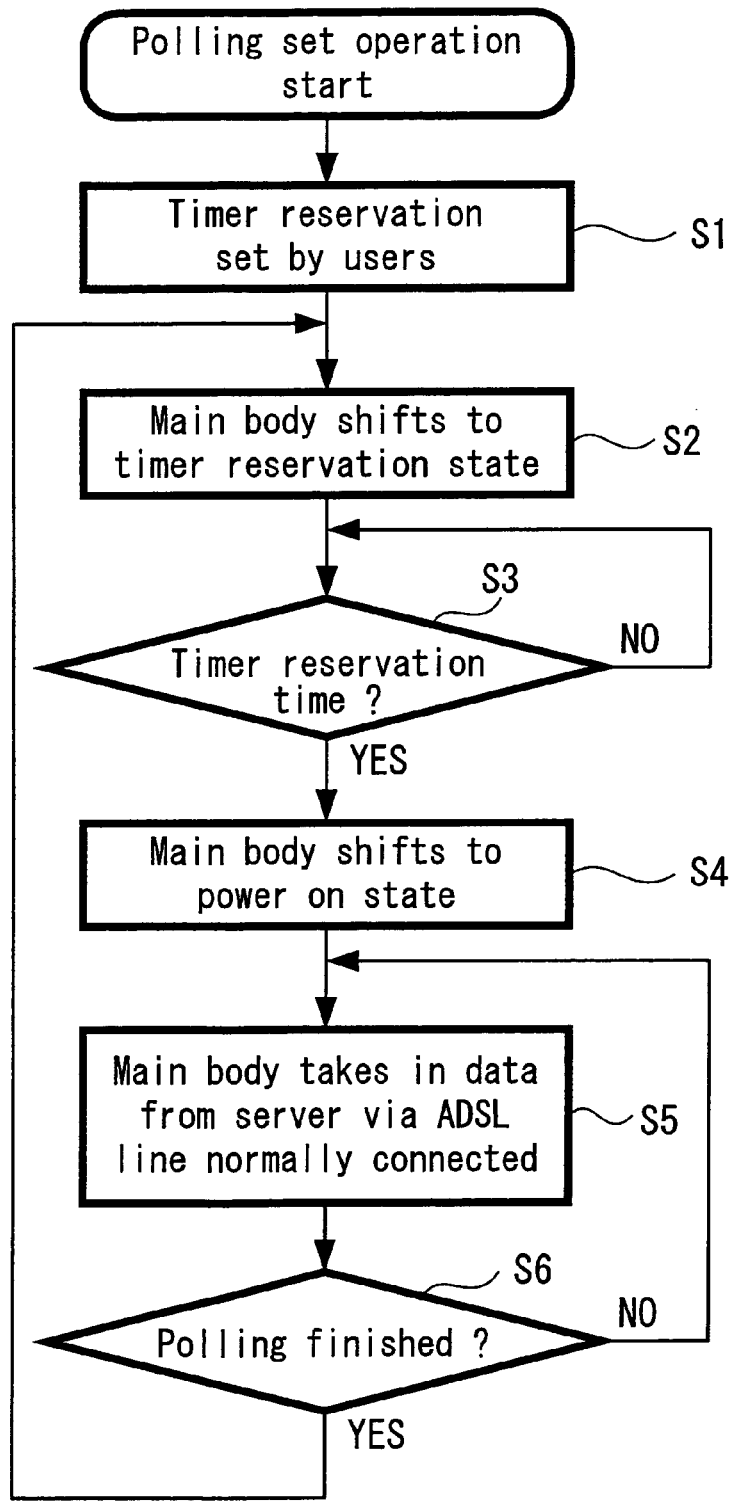
FIG. 2 is a flowchart showing a polling set operation.

First, the polling set operation which is a key point of the operation of this equipment body will be explained. FIG. 2 is a flowchart showing the polling set operation.

In FIG. 2, a timer reservation setting by users is performed in step S1. More specifically, users set a timer reservation time for starting the equipment by polling with respect to the CPU 1 by means of the timer reservation 12.

In step S2, the main body shifts to a standby state. More specifically, the CPU 1 controls to shift from a power-on state to a standby state by its state control function when the setting of the timer reservation 12 is completed.

In step S3, it is judged whether or not it is the timer reserved time. More specifically, the CPU 1 judges whether or not it is the timer reserved time set by the timer reservation 12.

When the timer reserved time comes in step S3, it is shifted to step S4 and in step S4, the main body is shifted to a power-on state. More specifically, the CPU 1 controls to shift from a standby state to a power-on state by its state control function when the timer reserved time set by the timer reservation 12 comes.

In step S5, the main body operates to take in data from the server by means of the ADSL line which is normally connected. More specifically, the CPU 1 performs a polling communications with the server 11 by its communication function at every timer reserved time for a definite duration via the network 10 by means of the ADSL line which is normally connected and downloads the reservation program information and version upgrade programs.

In step S6, it is judged whether or not the polling is finished. More specifically, the CPU 1 judges whether or not the polling communication with the server 11 is finished.

In step S6, if the polling is not finished, the flow returns to step S5 and the CPU 1 continues the polling communication with the server 11 until it ends.

In step S6, when the polling is finished, the flow returns to step S2 and the main body is shifted to a standby state. Then, when it is the timer reserved time next time in step S3, the flow is shifted to step S4, the main body is shifted to a power-on state in step S4, and the polling communication is continued in step S5 until it ends. Thereafter, processes and judgments of step S2 to step S6 repeats at every time of the polling end time and the set timer reserved time.

Next, it will be explained about the fan control operation after it is shifted to a power-on state.

Figure 3:
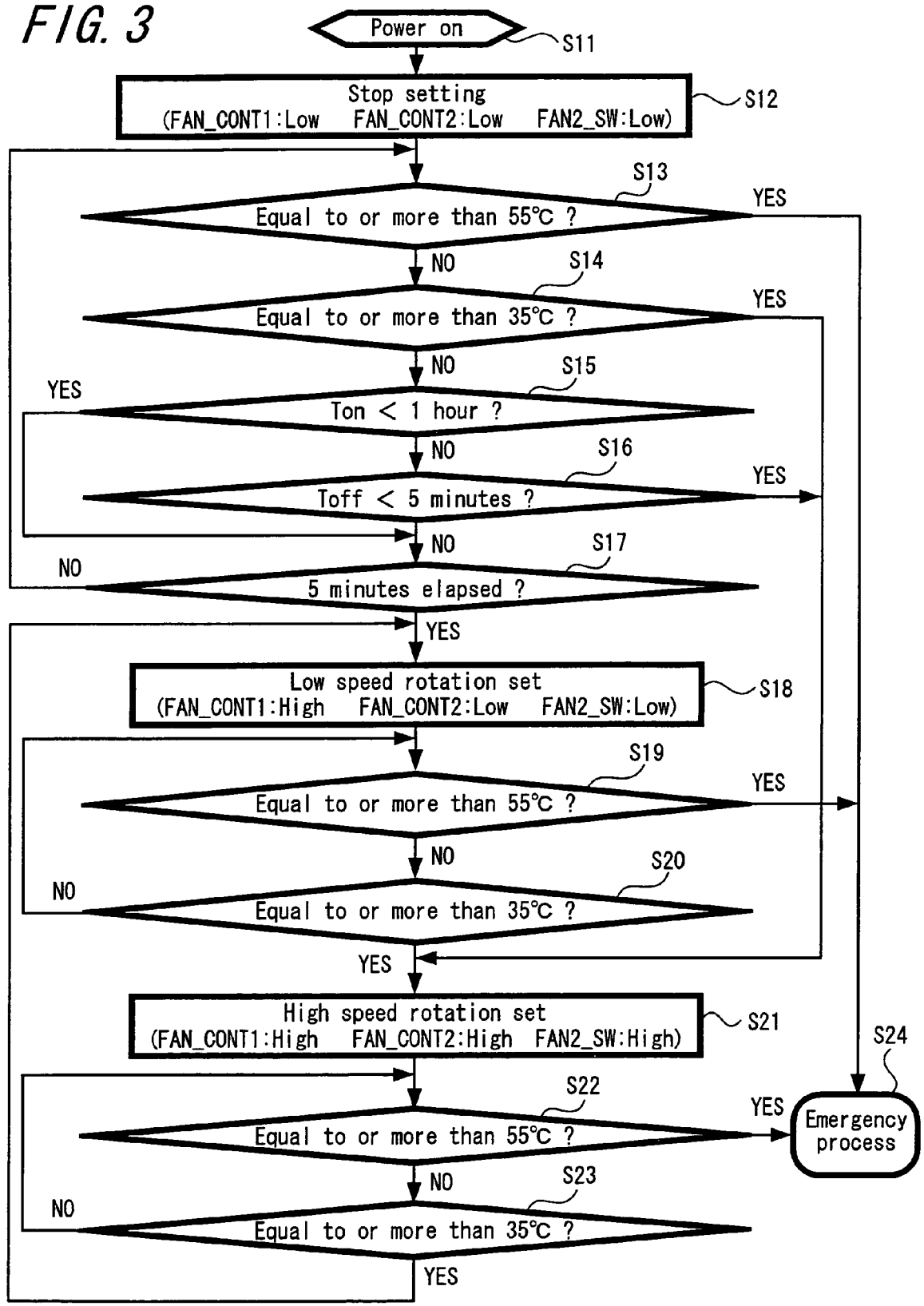
FIG. 3 is a flowchart showing a fan control operation.

FIG. 3 is a flowchart showing the fan control operation. FIG. 3 shows the fan control operation after the main body in step S4 shown in FIG. 2 is shifted to a power-on state.

In step S11, the equipment body is shifted to a power-on state. More specifically, the CPU 1 controls to shift from a standby state to a power-on state by its state control function when it becomes the timer reserved time set by the timer reservation 12 in step S4 shown in FIG. 2.

In step S12, a stop setting is performed. More specifically, with respect to the sub micom 4 for a stop condition, the CPU 1 makes the first fan control terminal FAN_CONT1 low-level (Low), the second fan control terminal FAN_CONT2 low-level (Low) and the fan switching control terminal FAN2_SW low-level (Low), all of which are controlled by a fan control program. In this way, the supply of the 12V-system-drive power supply voltage from the power supply board 5 and the relay board 6 to the first fan (FAN 1) 7 and the second fan (FAN 2) 8 is stopped, so that both of the first fan (FAN 1) 7 and the second fan (FAN 2) 8 become in a stop state.

In step S13, it is judged whether or not the internal temperature of the equipment body is equal to or more than 55 degree. More specifically, the CPU 1 judges with respect to the sub micom whether or not the temperature value detected by the temperature sensor 9 is equal to or more than 55 degree.

Thus, when performing a control where the temperature is preferential as in a conventional case, the fan cannot be stopped for 5 minutes at the starting time and also, it is impossible to set a constant stop period. On the other hand, according to the exemplified embodiment of the present invention, with respect to the sub micom 4, the CPU 1 makes it measure the internal temperature of the equipment by the temperature sensor 9, makes it observe the state by directing the first fan (FAN 1) 7 and the second fan (FAN 2) 8 to generate pulses corresponding to the rotational frequency and by using the rotation detecting terminals FAN_PULSE 1 and FAN_PULSE 2 and at the same time makes it control the supply of the 12V-system-drive supply voltage for the first fan (FAN 1) 7 and the second fan (FAN 2) 8.

In step S13, when the internal temperature of the equipment body is not equal to nor more than 55 degree, the flow is shifted to step S14 and it is judged in step S14 whether or not the internal temperature of the equipment body is equal to or more than 35 degree. More specifically, with respect to the sub micom 4, the CPU 1 judges whether or not the temperature value detected by the temperature sensor 9 is equal to or more than 35 degree. Here, 35° C. is a guarantee temperature of the used device.

In step S14, when the internal temperature of the equipment body is not equal to nor more than 35 degree, the flow is shifted to step S15 and it is judged in step S15 whether or not Ton<1 hour.

If Ton<1 hour is not satisfied in step S15, the flow is shifted to step S16 and it is judged in step S16 whether or not Toff<5 minutes.

When Toff<5 minutes is true in step S16, the flow is shifted to step S21 and a high speed rotation setting is performed in step S21. More specifically, with respect to the sub micom 4 for a high speed rotation condition, the CPU 1 makes the first fan control terminal FAN_CONT1 be a high-level (High), second fan control terminal FAN_CONT2 be a high-level (High), and the fan switching control terminal FAN2_SW be a high-level (High), all of which are controlled by the fan control program. In this way, the supply of the 12V-system-drive power supply voltage from the power supply board 5 and the relay board 6 to the first fan (FAN 1) 7 and the second fan (FAN 2) 8 is performed by a voltage value or a duty of a pulse width which corresponds to the high speed rotation setting, so that both the first fan (FAN 1) 7 and the second fan (FAN 2) 8 become a high speed rotating state.

Thus, when the Ton is equal or more than 1 hour and when the Toff is within 5 minutes, it is possible to cool such that the internal temperature of the equipment comes near the saturation temperature by rotating the first fan (FAN 1) 7 and the second fan (FAN 2) 8 in a high speed and effectively cooling the inside.

More specifically, the CPU 1 uses a timer which users can set according to the timer reservation 12 by its time control function, and the CPU 1, as shown in FIG. 5, recognizes the duration time Ton54 from the start (power on) 51 of the supply of the previous power supply voltage for the equipment body until the start (power on) 53 of the supply of this time power supply voltage for the equipment body, also recognizes the duration time Toff55 from the end (power off) 52 of the supply of the previous power supply voltage for the equipment body until the start (power on) 53 of the supply of this time power supply voltage for the equipment body, compares them with respect to the reference time so as to judge the temperature rising status of the equipment, and executes a control where it is possible to cancel the stop of the first fan (FAN 1) 7 and the second fan (FAN 2) 8. It should be noted that the start and the end herein are not limited to the start of the supply of the power supply voltage (power on) for the equipment body and the end of the supply of the power supply voltage (power off) for the equipment body, but include the rotation start and the rotation stop of the first fan (FAN 1) 7 and the second fan (FAN 2) 8 according to the polling.

If the Ton54 is equal or more than 1 hour and at the same time the Toff55 is within five minutes, it is possible to avoid a rapid increase of the temperature in the equipment by controlling the first fan (FAN 1) 7 and the second fan (FAN 2) 8 according to the flow of a high speed rotation process.

If that condition is not satisfied, it means that the temperature rise is not saturated, so that it means that a temperature-rising margin remains for stopping the first fan (FAN 1) 7 and the second fan (FAN 2) 8 for a predetermined period and it is possible to take a process for stopping the first fan (FAN 1) 7 and the second fan (FAN 2) 8 safely as usual for a predetermined period.

Here, if the Ton54 is equal or more than 1 hour and the Toff55 is within five minutes and if the first fan (FAN 1) 7 and the second fan (FAN 2) 8 are not made to be in a high speed rotation, the temperature in the equipment exceeds the saturation temperature of a case existence of a fan. Therefore, if the first fan (FAN 1) 7 and the second fan (FAN 2) 8 are made to be in a high speed rotation, the temperature in the equipment comes to approach the saturation temperature.

When Ton<1 hour is true in step S15 or when Toff<5 minutes is not satisfied in step S16, the flow is shifted to step S17 and it is judged in step S17 whether or not 5 minutes have elapsed since the equipment body is shifted to a power-on state. More specifically, the CPU 1 judges by its time control function whether or not a definite duration, that is, 5 minutes here has elapsed. It should be noted that it is possible for users to set the definite duration by the timer reservation 12 with respect to the CPU 1 such as to adjust it to the time when the CPU 1 finishes the polling communication with the server 11. Additionally, it is possible to set the definite duration value such as to adjust it to the time when the CPU 1 finishes the polling communication with the server 11 by sampling a plurality of polling periods.

If it does not elapse 5 minutes after the equipment body is shifted to a power-on state in step S17, the flow returns to step S13 and repeats the judgment whether or not the internal temperature of the equipment body is equal to or more than 55 degree in step S13, the judgment whether or not the internal temperature of the equipment body is equal to or more than 35 degree in step S14, the judgment whether or not Ton<1 hour in step S15, the judgment whether or not Toff<5 minutes in step S16, and the judgment whether or not 5 minutes elapsed after the equipment body was shifted to a power-on state in step S17.

In this way, since the polling period is short as for around 5 minutes after the starting time, the fan operation can be made stopped for a definite duration even when the state is shifted from a standby state to a power-on state of the polling start by controlling the first fan (FAN 1) 7 and the second fan (FAN 2) 8 for a time axis control to stop during that period such that quietness is maintained at the polling time so as to improve the ambient noise quality and to reduce the power consumption.

When 5 minutes elapsed after the equipment body was shifted to a power-on state instep S17, the flow is shifted to step S18, and a low speed rotation setting is performed in step S18. More specifically, with respect to the sub micom 4 for a stop condition, the CPU 1 makes the first fan control terminal FAN_CONT1 be a high-level (High), the second fan control terminal FAN_CONT2 be a low-level (Low) and the fan switching control terminal FAN2_SW be a low-level (Low), all of which are controlled by a fan control program. In this way, the supply of the 12V-system-drive and 24V-system-drive power supply voltages from the power supply board 5 and the relay board 6 to the first fan (FAN 1) 7 is performed by a voltage value or a duty of a pulse width which corresponds to the low speed rotation setting, so that only the first fan (FAN 1) 7 becomes a low speed rotating state.

In this way, with respect to the sub micom 4, the CPU 1 sets the drive voltage or the pulse-width duty low after 5 minutes from the starting time so as to rotate the first fan (FAN 1) 7 in a low speed and when the first fan (FAN 1) 7 and the second fan (FAN 2) 8 are stopped at the starting time, it is made such that the temperature rises but it does not rise to saturation degree owing to the short period, so that it is possible to maintain quietness at the polling end so as to improve the ambient noise quality and to reduce the power consumption.

It is judged in step S19 whether or not the internal temperature of the equipment body is equal to or more than 55 degree. More specifically, with respect to sub micom 4, CPU 1 judged whether or not the temperature value detected by the temperature sensor 9 is equal to or more than 55 degree.

In step S19, when the internal temperature of the equipment body is not equal to nor more than 55 degree, the flow is shifted to step S20 and it is judged in step S20 whether or not the internal temperature of the equipment body is equal to or more than 35 degree. More specifically, with respect to the sub micom 4, the CPU 1 judges whether or not the temperature value detected by the temperature sensor 9 is equal to or more than 35 degree. If the internal temperature of the equipment body is not equal to nor more than 35 degree in step S20, the flow returns to step S19 and repeats the judgment whether or not the internal temperature of the equipment body is equal to or more than 55 degree in step S19 and the judgment whether or not the internal temperature of the equipment body is equal to or more than 35 degree in step S20.

If the internal temperature of the equipment body is equal to or more than 35 degree in step S14 and step S20, the flow is shifted to step S21 and a high speed rotation setting is performed in step S21. More specifically, with respect to the sub micom 4 for a high rotation condition, the CPU 1 makes the first fan control terminal FAN_CONT1 be a high-level (High), the second fan control terminal FAN_CONT2 be a high-level (High) and the fan switching control terminal FAN2_SW be a high-level (High), all of which are controlled by a fan control program. In this way, the supply of the 12V-system-drive power supply voltage from the power supply board 5 and the relay board 6 to the first fan (FAN 1) 7 and the second fan (FAN 2) 8 is performed by a voltage value or a duty of a pulse width which corresponds to the high speed rotation setting, so that both the first fan (FAN 1) 7 and the second fan (FAN 2) 8 becomes a high speed rotating state.

In this way, when the internal temperature becomes equal to or more than 35° C., the first fan (FAN 1) 7 and the second fan (FAN 2) 8 is made rotated in a high speed and the inside is cooled such that the internal temperature can be cooled equal to or less than 35° C. which is the guarantee temperature of the used device.

It is judged in step S22 whether or not the internal temperature of the equipment body is equal to or more than 55 degree. More specifically, the CPU 1 judges with respect to the sub micom 4 whether or not the temperature value detected by the temperature sensor 9 is equal to or more than 55 degree.

In step S22, when the internal temperature of the equipment body is not equal to nor more than 55 degree, the flow is shifted to step S23 and it is judged in step S23 whether or not the internal temperature of the equipment body is equal to or more than 35 degree. More specifically, with respect to the sub micom 4, the CPU 1 judges whether or not the temperature value detected by the temperature sensor 9 is equal to or more than 35 degree. Here, 35° C. is a guarantee temperature of the used device.

If the internal temperature of the equipment body is not equal to nor less than 35 degree in step S23, the flow returns to step S22 and repeats the judgment whether or not the internal temperature of the equipment body is equal to or more than 55 degree in step S22 and the judgment whether or not the internal temperature of the equipment body is equal to or less than 35 degree in step S23.

If the internal temperature of the equipment body is equal to or less than 35 degree in step S23, the flow returns to step S18 and repeats the low rotation setting in step S18, the judgment whether or not the internal temperature of the equipment body is equal to or more than 55 degree in step S19 and the judgment whether or not the internal temperature of the equipment body is equal to or more than 35 degree in step S20 and further repeats the high rotation setting in step S21, the judgment whether or not the internal temperature of the equipment body is equal to or more than 55 degree in step S22 and the judgment whether or not the internal temperature of the equipment body is equal to or less than 35 degree in step S23.

If the internal temperature of the equipment body is equal to or more than 55 degree in step S13, step S19 or step S22, the flow is shifted to step S24 and an emergency process is performed in step S24. More specifically, as the CPU 1 considers with respect to sub micom 4 that 55° C. is abnormal for the internal temperature, it is designed, for example, that the CPU 1 performs by its state control function an emergency process by controlling such that it is shifted from the power-on state to the power-off state.

In this way, the CPU 1 makes the sub micom 4 observe the temperature by using the feedback of the temperature value to the both CPU 1 and, the sub micom 4 by means of the temperature sensor 9 such that a high speed rotation response of the first fan (FAN 1) 7 and the second fan (FAN 2) 8 when the temperature rises and also an emergency respose at an abnormally high temperature (equal to or more than 55 degree) can be performed.

In this way, the equipment having a network connecting function is made quiet at the polling time and the power consumption is reduced by stopping the fan when the power supply is made on. At this time, an effect is obtained such that the temperature in the equipment body is lowered by controlling the fan according to a predicted time when the temperature in the equipment body will reach the saturation temperature.

Figure 4:
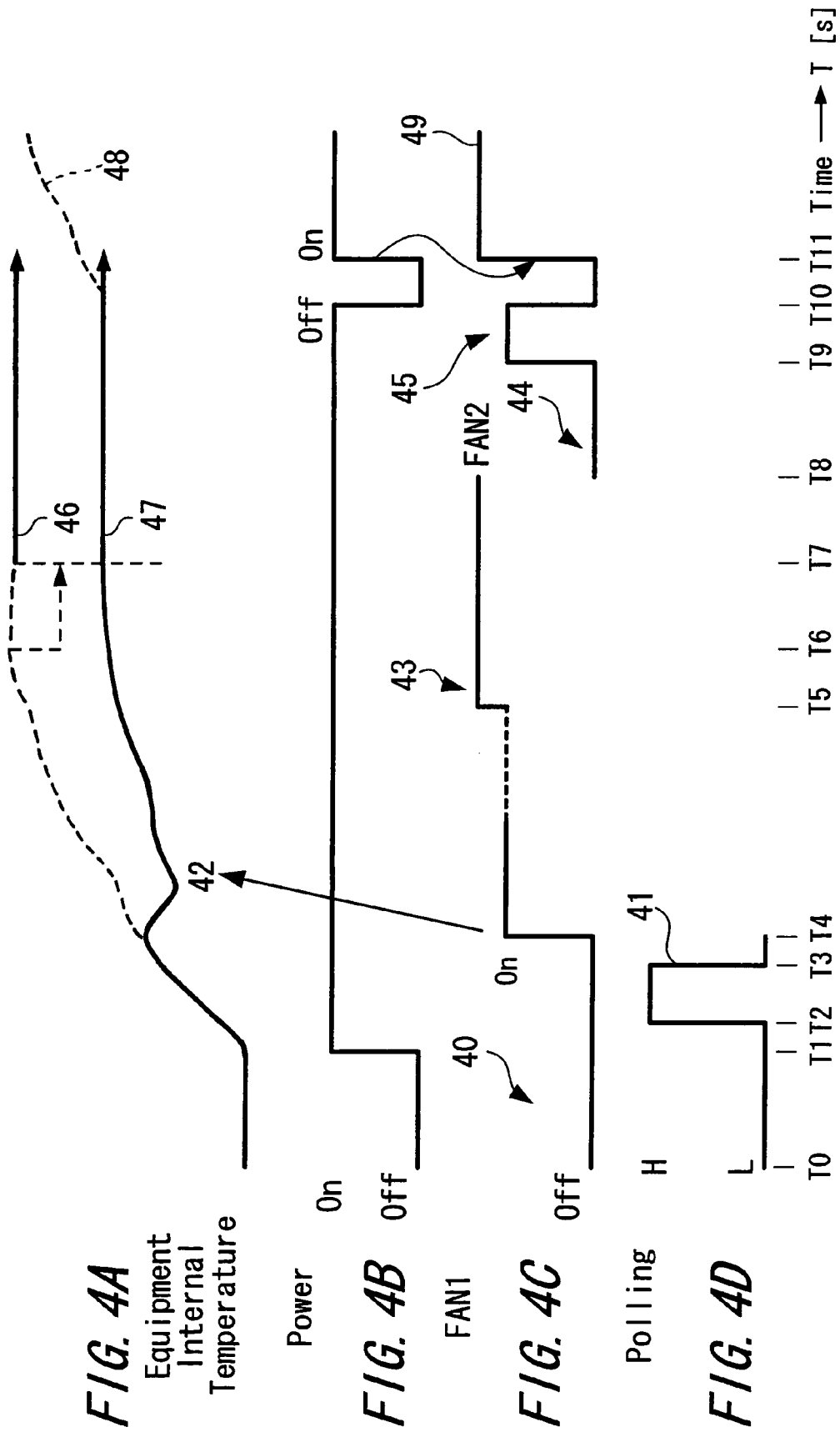
FIG. 4 are time charts showing operations where

FIGS. 4 are time charts showing operations where FIG. 4A shows the internal temperature of the equipment body, FIG. 4B shows the power state of the equipment body, FIG. 4C shows the operation of a first fan (FAN 1) 7 and a second fan (FAN 2) 8, and FIG. 4D shows a polling operation.

In FIGS. 4, the equipment body is a power-off state from T0 to T1. For the transfer 41 of the program reservation data and the program itself according to the polling operation shown as T1 to T4 (includes from T2 to T3) in FIG. 4D, the equipment body is shifted to an on-state after T1. This operation corresponds to the power-on state shown as step S11 in FIG. 3.

Practically, communication is performed between the equipment body and the server before and after the program reservation data and program transfer 41 (from T2 to T3) for recognition (from T1 to T2) for the transmission and affirmation (from T3 to T4) after transferred with respect to the server by the equipment body.

The operation of the first fan (FAN 1) 7 and the second fan (FAN 2) 8 shown in FIG. 4C becomes from T0 to T4 such that the equipment body shown in FIG. 4B is in a power-off state from T0 to T1 and is in a quiet state 40 from T1 to T4 during the polling by the polling operation shown in FIG. 4D. The duration from T1 to T4 corresponds, for example, to 5 minutes. This operation corresponds to the stop-setting shown as step S12 with reference to FIG. 3 and the judgment shown as step S17 whether or not 5 minutes have elapsed since the equipment body was shifted to power-on state.

The operation of the first fan (FAN 1) 7 shown in FIG. 4C becomes ON from T4 to T5 and performs a low speed rotate operation. This operation corresponds to the low speed rotation setting shown as step S18 in FIG. 3.

The internal temperature of the equipment body shown in FIG. 4A rapidly increases by the off-operation of the first fan (FAN 1) 7 and the second fan (FAN 2) 8 shown in FIG. 4C according to the polling operation from T1 to T4 shown in FIG. 4D, but it does not reach the saturation temperature 46 and once it decreases and thereafter moderately increases as shown as 42 owing to the on operation of the first fan (FAN 1) 7 at the T4 time point shown in FIG. 4C. At the T6 time point, the temperature appears as the saturation temperature 46 if there is no fan operation.

Also by the on-operation of the first fan (FAN 1) 7 at the T4 time point shown in FIG. 4C, the internal temperature of the equipment body is to reach, at the T7 time point, the saturation temperature 47 which is one when there is a fan operation. At the T7 time point, the temperature appears as the saturation temperature 47 if there is a fan operation.

Here, it is assumed that there is little influence to the temperature rise by stopping the fan for a short period at the starting time. The reason thereof is because the time until the temperature in the equipment saturates is very long such that there is no influence of stopping the fan in a short period at the starting time.

Consequently, by the on operation of the first fan (FAN 1) 7 and the second fan (FAN 2) 8 from T5 to T8 shown in FIG. 4C, a high speed rotation is adopted at the high temperature so as to decrease the temperature as shown as 43. This operation corresponds to the high speed rotation setting shown as step S21 in FIG. 3.

This operation corresponds to a case of shifting to a low speed rotation setting as shown as step S18 when it is judged that the internal temperature of the equipment body is equal to or more than 35 degree in step S23 in FIG. 3.

By the on operation of the first fan (FAN 1) 7 from T9 to T10 shown in FIG. 4C, a low speed rotation is adopted at the high temperature so as to decrease the temperature as shown as 45. This operation corresponds to the low speed rotation setting shown as step S18 in FIG. 3.

As shown by the numeral 47 the internal temperature of the equipment body reaches the saturation temperature after 1 hour. Thereafter, the supply of the power supply voltage for the equipment body is made stopped (power off) at the T10 time point after the internal temperature of the equipment body reaches the saturation temperature, just subsequently at the T11 time point, by starting (power on) the supply of the power supply voltage for the equipment body, the temperature in the equipment body increases beyond the saturation temperature as shown as 48 and when these power-on and power-off operations are repeated a plurality of times, the temperature rises moreover, but it is made to come closer the saturation temperature by reducing the temperature rise in the equipment body which exceeds the saturation temperature by means of the high speed rotation at the T11 time point as shown as 49. The operation corresponds to the judgment that Ton<1 hour is not true in step S15, the judgment that Toff<5 minutes is true in step S16 and the high speed rotation setting in step S21 shown in FIG. 3.

The reducing operation of the temperature rise in the equipment is explained hereinafter according to an experiment result of the applicant. It is assumed as the condition of measuring the set temperature that the HDD 3 is under a reproducing state (PB) and the power-off and the power-on operations are repeated so as to measure 10 times after it becomes the saturation temperature where the heatsink of the power supply unit and each device are made as objects for measuring points of the temperature in the equipment by using the temperature sensor 9.

The experiment was carried out in such a manner that the power-off and the power-on operations are repeated within 5 minutes after the temperature in the equipment becomes the saturation temperature. As the state where the fan does not rotate continues, the temperature at each unit rises. The temperature becomes equal or more than the saturation temperature even at the first time. The temperature sensor 9 becomes equal to or more than 35° C. after the third power-on and the fan rotates in a high speed, so that the temperature decreases. If the power-on state is made to continue as it is, it again becomes the saturation temperature. According to aforementioned experiment, the power-on is repeated furthermore, so that the temperature rises again. After 10 times of power-off and power-on operations repeat, the aforesaid temperature change returns to a normal situation and finally becomes the saturation temperature. In this case, it becomes equal or more than the saturation temperature unless the fan is made rotated in a high speed. Further, if the fan is made rotated in a high speed by aforementioned time control function, it rapidly returns to the saturation temperature.

The temperature rises at the power-off and the power-on of the first time. At that time, if the fan rotates in a high speed, the temperature decreases and again comes near the saturation temperature. However, as the power-off and the power-on operations again repeat, the temperature rises. The temperature sensor 9 becomes equal to or more than 35° C. at the power-off and the power-on of the third time and the fan rotates in a high speed rotate, so that the temperature decreases. If the power-on state is made to continue as it is, it becomes the saturation temperature. After 10 times of power-off and power, it returns to the saturation temperature.

In this way, an effect can be obtained such that quietness is realized at the polling time of the equipment having a network connecting function and the power consumption is reduced by the fan stop when the power supply is made ON. At that time, by performing the fan control according to a predicted time when the temperature in the equipment body reaches the saturation temperature, the temperature in the equipment body can be lowered and an efficient cooling effect can be obtained by using the equipment timer such that an effect that the reliability is improved can be obtained.

The above mentioned exemplified embodiments according to the present invention are not limited only by the disclosure and it is needless to say that appropriate changes can be applied without departing from the scope of the claims of the present invention.

The fan control apparatus according to the present invention, as a fan control apparatus which cools the inside of an equipment body by a cooling fan provided in said equipment body, comprises temperature detecting means for detecting the temperature in said equipment body; temperature control means for controlling said cooling fan according to the temperature value detected by said temperature detecting means; communication means for communicating with a server connected to said equipment body by means of a network; and time control means for controlling said cooling fan according to the time value based on at least previous and this time communication commencements by said communication means; wherein the control of said cooling fan is performed by using said temperature control means and said time control means, so that the cooling fan is controlled according to the time value based on the communication commencement by the communication means using the time control means in addition to the feedback of the detected temperature value to the temperature control means using the temperature detecting means where noise reduction can be realized by the time axis control of the fan and at that time, by performing the fan control according to a predicted time when the temperature in the equipment body reaches the saturation temperature, the temperature in the equipment body can be lowered and an efficient cooling effect can be obtained by using the equipment timer such that an effect that the reliability is improved can be obtained.

Additionally, in the fan control apparatus according to the present invention, said communication means performs communication of a definite duration in a predetermined interval as mentioned above and said time control means stops the operation of said cooling fan until the value of said definite duration elapses, so that it is possible to reduce noises, owing to the fact that the polling period by the communication means is a short period, by using a method where the fan operation is made stopped for a definite duration from the starting time by means of the time control means and an effect that quietness can be realized at the polling time of the equipment which has the network connecting function, the power consumption can be reduced by the fan stop when the power supply is made on, and the temperature in the equipment body can be lowered is obtained at that time by performing the fan control based on the time.

Also, in the fan control apparatus according to the present invention as mentioned above, said time control means further performs the control of said cooling fan according to the time value based on previous communication end and this time communication start; so that it has an effect to reduce the temperature in the equipment body by performing the fan control on the assumption that the temperature would not become under the saturation temperature when the duration between the previous communication end and this time communication start is relatively short within, for example, 5 minutes.

Also, in the fan control apparatus according to the present invention as mentioned above, the time value based on said previous and this time communication commencements corresponds to the time when the temperature in said equipment body detected by said temperature detecting means reaches the saturation temperature, so that it has such as effect that the fan control can be performed according the time when the temperature in the equipment body is predicted to reach the saturation temperature.

Further, in the fan control apparatus according to the present invention as mentioned above, said time control means performs said cooling fan control when said equipment body is made to be a power-on state after the time has elapsed since the time when the temperature in said equipment body detected by said temperature detecting means is predicted to reach the saturation temperature and when just subsequently said apparatus is made to be a power-on state, so that the temperature moreover rises when these power-on and power-off are made repeated a plurality of times, but it has such an effect that the temperature can be approached to the saturation temperature by rotating the fan in a high speed so as to stop the temperature rise in the equipment body over the saturation temperature and to reduce the temperature.

Additionally, the fan control method according to the present invention, as a fan control method which cools the inside of an equipment body by a cooling fan provided in said equipment body, comprises communication step for communicating by using communication means with a server connected to said equipment body by means of a network; temperature detecting step for detecting the temperature in said equipment body by using temperature detecting means; temperature control step for controlling said cooling fan by using temperature control means according to the temperature value detected by said temperature detecting means; and time control step for controlling said cooling fan by using time control means according to the time value based on at least previous and this time communication commencements by said communication means; wherein the control of said cooling fan is performed by using said temperature control means and said time control means, or the cooling fan is controlled according to the time value based on the communication commencement by the communication step using the time control step in addition to the feed back of the detected temperature value to the temperature control step using the temperature detecting step, so that noise reduction can be realized by the time axis control of the fan and at that time, by performing the fan control according to a predicted time when the temperature in the equipment body reaches the saturation temperature, the temperature in the equipment body can be lowered and an efficient cooling effect can be obtained by using the equipment timer such that an effect that the reliability is improved can be obtained.

Additionally, in the fan control method according to the present invention, said communication step performs communication of a definite duration in a predetermined interval as mentioned above and said time control step stops the operation of said cooling fan until the value of said definite duration elapses, so that it is possible to reduce noises, owing to the fact that the polling period by the communication step is a short period, by using a method where the fan operation is made stopped for a definite duration from the starting time by step of the time control step, thus the equipment having a network connecting function is made quiet at the polling time and the power consumption is reduced by stopping the fan when the power supply is made ON and at that time, by performing the fan control based on the time, an effect that quietness can be realized at the polling time of the equipment which has the network connecting function, the power consumption can be reduced by the fan stop when the power supply is made on, and the temperature in the equipment body can be lowered, is obtained.

Also, in the fan control method according to the present invention as mentioned above, said time control step further performs the control of said cooling fan according to the time value based on previous communication end and this time communication start, so that this fan control method has an effect to reduce the temperature in the equipment body by performing the fan control on the assumption that the temperature would not become under the saturation temperature when the duration between the previous communication end and this time communication start is relatively short within, for example, 5 minutes.

Also, in the fan control method according to the present invention as mentioned above, the time value based on said previous and this time communication commencements corresponds to the time when the temperature in said equipment body detected by said temperature detecting step reaches the saturation temperature, so that this fan control method has such as effect that the fan control can be performed according the time when the temperature in the equipment body is predicted to reach the saturation temperature.

Further, in the fan control method according to the present invention as mentioned above, said time control step performs said cooling fan control when said equipment is made to be a power-off state after the time has elapsed since the time when the temperature in said equipment body detected by said temperature detecting step is predicted to reach the saturation temperature and just subsequently said equipment is made to be a power-on state, so that the temperature in said equipment body rises beyond the saturation temperature and the temperature moreover rises when these power-on and power-off are made repeated a plurality of times, but this fan control method has such an effect that the temperature can be approached to the saturation temperature by rotating the fan in a high speed so as to stop the temperature rise in the equipment body over the saturation temperature and to reduce the temperature.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A fan control apparatus for cooling an inside of an equipment body by a cooling fan arranged in said equipment body, the apparatus comprising:
    temperature detecting means for detecting a temperature in said equipment body;
    temperature control means for controlling said cooling fan according to a temperature value detected by said temperature detecting means;
    communication means for communicating with a server connected to said equipment body by a network; and
    time control means for controlling said cooling fan according to a first time value based on a start of a previous commencement of a time communication and a start of a present commencement of a time communication by said communication means and a second time value based on an end of the previous commencement of a time communication and the start of the present commencement of a time communication by said communication means,
    wherein control of said cooling fan is performed by using said temperature control means and said time control means.

2. The fan control apparatus according to claim 1, wherein said communication means performs communication for a defined time duration at predetermined times and said time control means stops the operation of said cooling fan until said defined time duration elapses.

3. The fan control method according to claim 1, wherein the first time value corresponds to a time when the temperature in said equipment body that is detected by said temperature detecting means reaches a predetermined saturation temperature.

4. A fan control apparatus for cooling an inside of an equipment body by a cooling fan arranged in said equipment body, the apparatus comprising:
    temperature detecting means for detecting a temperature in said equipment body;
    temperature control means for controlling said cooling fan according to a temperature value detected by said temperature detecting means;
    communication means for communicating with a server connected to said equipment body by a network; and
    time control means for controlling said cooling fan according to a time value based on a previous commencement of a time communication and a present commencement of a time communication by said communication means,
    wherein control of said cooling fan is performed by using said temperature control means and said time control means, and
    wherein said time control means controls said cooling fan when said equipment is set to a power-off state after an elapsed time when the temperature in said equipment body detected by said temperature detecting means is predicted to reach a predetermined saturation temperature and subsequently said equipment is set to a power-on state.

5. A fan control method for cooling an inside of an equipment body by a cooling fan arranged in said equipment body, the method comprising:
    a communication step for communicating a time by using a communication unit with a server connected to said equipment body by a network;
    a temperature detecting step for detecting a temperature in said equipment body by using temperature detector;
    a temperature control step for controlling said cooling fan by using a temperature controller according to a temperature value detected by said temperature detector; and
    a time control step for controlling said cooling fan by using time control unit according to a first time value based on a start of a previous commencement of a time communication and a start of a present commencement of a time communication by said communication unit and a second time value based on an end of the previous commencement of a time communication and the start of the present commencement of a time communication by said communication unit,
    wherein control of said cooling fan is performed by using said temperature controller and said time control unit.

6. The fan control method according to claim 5, wherein said communication step includes performing communication for a defined time duration at predetermined times and said time control step stops the operation of said cooling fan until the defined time duration elapses.

7. The fan control method according to claim 5, wherein the first time value corresponds to a time when the temperature in said equipment body detected by said temperature detecting step reaches a predetermined saturation temperature.

8. A fan control method for cooling an inside of an equipment body by a cooling fan arranged in said equipment body, the method comprising:
    a communication step for communicating a time by using a communication unit with a server connected to said equipment body by a network;

a temperature detecting step for detecting a temperature in said equipment body by using temperature detector;

a temperature control step for controlling said cooling fan by using a temperature controller according to a temperature value detected by said temperature detector; and a time control step for controlling said cooling fan by using time control unit according to a time value based on a previous and a present commencement of a time communication by said communication unit, wherein control of said cooling fan is performed by using said temperature controller and said time control unit, and wherein said time control step controls said cooling fan when said equipment is set to a power-off state after an elapsed time when the temperature in said equipment body detected by said temperature detecting step is predicted to reach the predetermined saturation temperature and subsequently, said equipment is set to a power-on state.

* * * * *